United States Patent [19]
Lam et al.

[11] Patent Number: 5,691,549
[45] Date of Patent: Nov. 25, 1997

[54] SIDEWALL STRAP

[75] Inventors: Chung Hon Lam, Williston; James S. Nakos, Essex; Donald McAlpine Kenney, Shelburne; Eric Adler, Jericho, all of Vt.

[73] Assignee: International Business Machines Corporation, Armonk, N.Y.

[21] Appl. No.: 720,991

[22] Filed: Oct. 15, 1996

Related U.S. Application Data

[63] Continuation of Ser. No. 362,692, Dec. 22, 1994, abandoned.

[51] Int. Cl.$^6$ .................. H01L 29/80; H01L 31/112
[52] U.S. Cl. .................. 257/282; 257/283; 257/301; 257/344; 257/900; 437/61; 437/72
[58] Field of Search .................. 257/282, 283, 257/301, 900, 344; 437/61, 65, 72, 175

[56] References Cited

U.S. PATENT DOCUMENTS

| | | | |
|---|---|---|---|
| Re. 32,207 | 7/1986 | Levinstein et al. | 427/85 |
| 3,890,178 | 6/1975 | Lebailly | 156/8 |
| 4,466,212 | 8/1984 | Bhatia et al. | 148/187 |
| 4,507,171 | 3/1985 | Bhatia et al. | 156/643 |
| 4,532,532 | 7/1985 | Jackson | 357/15 |
| 4,581,815 | 4/1986 | Cheung et al. | 29/577 |
| 4,688,063 | 8/1987 | Lu et al. | 357/23.6 |
| 4,785,337 | 11/1988 | Kenney et al. | 357/23.6 |
| 4,914,501 | 4/1990 | Rivoli et al. | 357/68 |
| 5,146,291 | 9/1992 | Watanabe et al. | 257/344 |
| 5,160,987 | 11/1992 | Pricer et al. | 257/307 |
| 5,185,294 | 2/1993 | Lam et al. | 437/193 |
| 5,208,472 | 5/1993 | Su et al. | 257/900 |
| 5,264,716 | 11/1993 | Kenney et al. | 257/301 |
| 5,363,327 | 11/1994 | Henkles et al. | 257/301 |
| 5,365,097 | 11/1994 | Kenney et al. | 257/302 |

OTHER PUBLICATIONS

C.G. Jambotkar, "Submicrometer-Wide Polysilicon Resistors", IBM Technical Disclosure Bulletin, vol. 25, No. 9, Feb., 1983.

H.S. Bhatia et al., "Process For Making Sidewall Resistors With Single Crystal Contacts", IBM Technical Disclosure Bulletin, vol. 26, No. 2, Jul. 1983.

D.M. Kenney, "Diffusion Defined Bridge Contact", IBM Technical Disclosure Bulletin, vol. 29, No. 8, Jan. 1987.

*Primary Examiner*—Tom Thomas
*Assistant Examiner*—David Ostrowski
*Attorney, Agent, or Firm*—James M. Leas

[57] ABSTRACT

The present invention is a sidewall connector providing a conductive path linking at least two conductive regions. The sidewall connector has a top portion comprising surface. A conductive member contacts the top portion, connecting the rail to a conductive region or to an external conductor. An etch stop layer located on a conductive region can be used to protect the conductive region during the directional etch to form the sidewall connector. A conductive bridge is then used to link exposed portions of the conductive region and the conductive sidewall rail, the conductive bridge extending across the thickness of the etch stop layer. A "T" connector is formed by the process, starting with a pair of intersecting sidewalls wherein the two sidewalls have top edges at different heights where they intersect. The connector is used to form a strap for a DRAM cell.

18 Claims, 6 Drawing Sheets

SIDEWALL STRAP

This application is a continuation of application Ser. No. 08/362,692, filed Dec. 22, 1994, now abandoned.

FIELD OF THE INVENTION

This invention generally relates to semiconductor interconnection techniques. More particularly, it relates to a conductive sidewall rail linking a pair of conductive regions. Even more particularly, it relates to a sidewall rail that extends in several directions and to a sidewall rail strap to connect the transistor and capacitor of a DRAM cell.

BACKGROUND OF THE INVENTION

In integrated circuits, large numbers of structures typically must be interconnected, and interconnect conductors use up a significant portion of the surface area of the semiconductor chip. Typically, these conductors are formed as thin films of conductor deposited on insulating materials on the semiconductor surface and defined as lines photolithographically. Efforts to shrink the conductors are limited since line widths can be no smaller than the minimum photolithographically defined line. The cost of decreasing the photolithographic minimum dimension is high, and each such effort has defined succeeding generations of semiconductor products.

In particular, the photolithographically defined interconnect between the node diffusion and trench capacitor of a DRAM cell has posed problems in several generations of DRAM products. This strap must provide a reliable connection with acceptable resistance in a small area.

One approach to avoid the photolithographic limit is the conductive sidewall rail. The width of such rails is determined by the thickness of the deposited conductor, and this thickness can be significantly less than a minimum photolithographic dimension. Articles by C. G. Jambotkar in the IBM Technical Disclosure Bulletin Vol. 25, No. 9, February 1983, p 4785 (Jambotkar) and by H. S. Bhatia, et al in the IBM Technical Disclosure Bulletin Vol. 26, No. 2, July 1983, p 623 (Bhatia) disclose polysilicon resistor rails formed by deposition and directional etch along sidewalls of a window etched in an insulator. In Jambotkar, the rails are formed on insulator. In Bhatia, two ends of the rail are deposited directly on single crystal silicon to form a sidewall connection between two doped regions. A problem arises in Bhatia's process in that exposed silicon adjacent the rails would be attacked during the directional etching of polysilicon to form the rails. Particularly if the single crystal comprises thin doped regions, the damage could degrade device and chip performance.

Commonly assigned U.S. Pat. No. 4,785,337 ("the '337 patent"), issued to D. M. Kenney, (FIG. 9a) does not address this problem with respect to contact between a conductive sidewall rail strap and a node diffusion. The '337 patent and commonly assigned U.S. Pat. No. 5,365,097 issued to D. M. Kenney, (FIG. 13b) also illustrate a second contact between the conductive sidewall rail and another conductor, the contact being along the inner surface of the rail, that is the surface of the rail along the sidewall and most protected from the directional etch.

Thus, a structure and means to form conductive sidewalls is needed that avoids significant attack on exposed doped regions.

SUMMARY OF THE INVENTION

It is, therefore, an object of the present invention to provide a sidewall rail connector that contacts a doped region without causing damage to the doped region.

It is another object of this invention to provide a self-aligned sidewall rail strap linking node diffusion and capacitor for a DRAM cell.

It is another object of this invention to provide a self-aligned sidewall rail connector that extends in several directions.

These and other objects of the invention are accomplished by a semiconductor structure having a first and a second conductive region. A conductive sidewall rail extends between the conductive regions for providing a conductive path linking the conductive regions. The rail has a first top portion comprising a first outer surface. A conductive member contacts the top portion of the rail and connects the top portion of the rail to one of the conductive regions.

In one embodiment, an etch stop layer is located on a portion of a conductive region. The conductive sidewall rail is on the etch stop layer. A conductive bridge links an exposed portion of the conductive region and the top portion of the rail, the bridge extending across the thickness of the etch stop layer.

The sidewall rail connector so formed can link a plurality of conductive regions along a line in one plane, or conductive regions can be at different vertical levels. In addition, a conductive sidewall rail can intersect with another sidewall rail to form a T-shaped connector.

A specific embodiment of the invention is accomplished by a process for connecting two conductive regions on a semiconducting substrate, the method comprising the steps of: forming a sidewall on the substrate, wherein the conductive regions are adjacent the sidewall; depositing a conductor on the sidewall; directionally etching the conductor so as to leave a conductive sidewall rail adjacent the sidewall, and forming a conductive member contacting the top portion of the rail, wherein the rail electrically links the two conductive regions.

A further specific embodiment of the invention is accomplished by the above process further comprising the steps of forming an etch stop layer on one of the conductive regions to protect the region during a subsequent directional etch; etching an exposed portion of the etch stop layer to open contact to this conductive region; and forming a conductive bridge linking the conductive region and the first top portion.

These and other objects and advantages of the invention will become apparent from the drawings and description of the invention.

DETAILED DESCRIPTION OF THE INVENTION

The first embodiment of the present invention illustrated in FIGS. 1–5, provides a conductive sidewall rail formed of a material etched in common with conductive regions to be interconnected. The method provides a self-aligned interconnect while providing protection for an underlying conductive region during the directional etching of the sidewall rail. For example, the sidewall rail and the underlying conductive region may both be formed from doped silicon. The invention allows the directional etching of the silicon sidewall rail without the risk of the etch continuing too far, damaging the underlying silicon conductive region. The sidewall rail of the present invention substantially provides the electrical conductive path, that is, the lowest resistance path, between two conductive regions.

The term "horizontal" as used in this application is defined as a plane parallel to the conventional planar surface of a semiconductor chip or wafer, regardless of the orientation the chip is actually held. The term "vertical" refers to a direction perpendicular to the horizontal as defined above. Prepositions, such as "on," "side," (as in "sidewall"), "higher," "lower," "over," and "under" are defined with respect to the conventional planar surface being on the top surface of the chip or wafer, regardless of the orientation the chip is actually held.

Single crystal semiconducting wafers used in the processes illustrated in FIGS. 1–6 are formed from materials such as silicon, germanium, and gallium arsenide. Because silicon is most widely used and the most is known about its etch properties, silicon will be used for illustration hereinbelow. The wafer may have had implants, diffusions, oxidations, and other process steps completed before embarking on the process sequences described hereinbelow.

Figure 1:
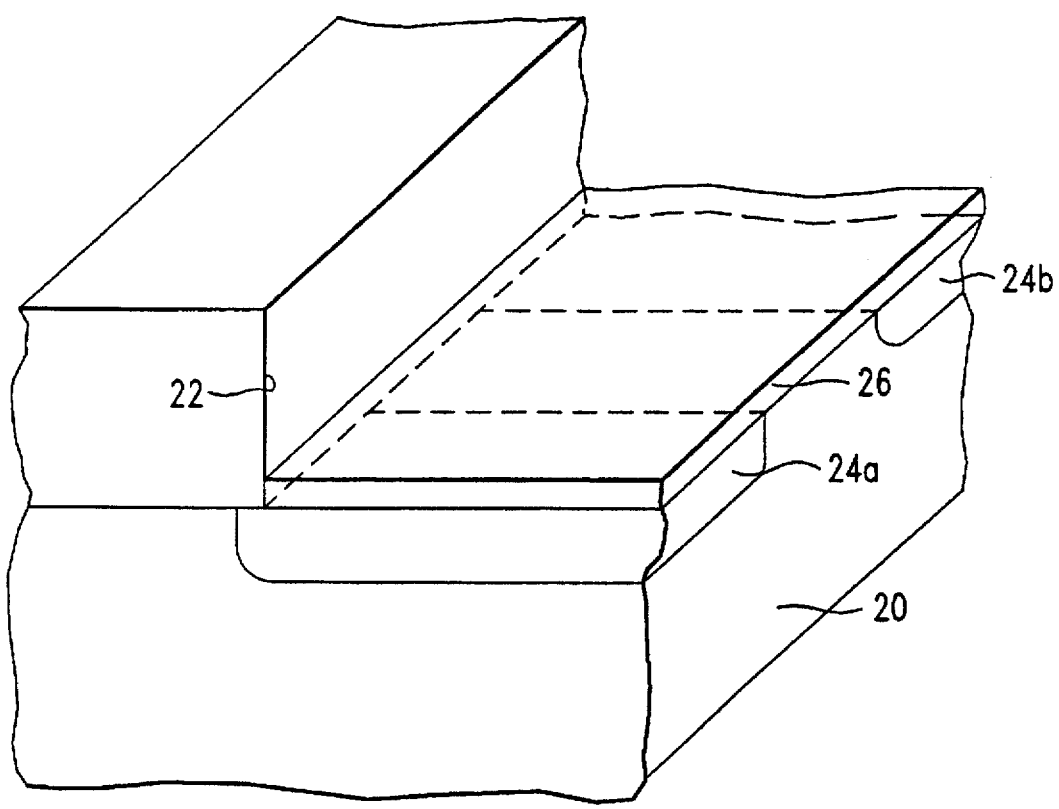
FIG. 1 is a perspective view showing a process step for making a rail connector in accordance with the invention.
Figure 2:
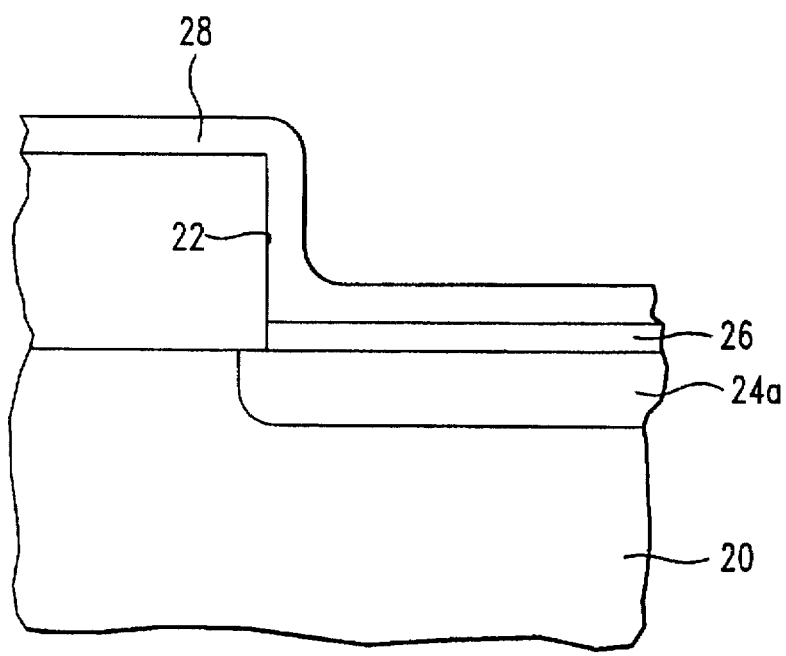
FIGS. 2–4 and 5a–5b are cross-sectional views showing additional process steps for making a rail connector in accordance with the invention.

Referring now to FIG. 1, the present invention is formed on substrate 20 which has sidewall 22 adjacent to a pair of conductive regions 24a and 24b. In this embodiment, conductive region 24b is horizontally displaced from conductive region 24a. Etch stop layer 26 is disposed on conductive regions 24a and 24b. Substrate 20 may also have other semiconductor devices, diffusions, insulators, and conductive layers. Preferably sidewall 22 is vertical, but the angle can vary, as long as a spacer remains after a directional etch.

Sidewall 22 may be the side edge of an insulator or an insulated conductor such as a wordline. Sidewall 22 is formed by methods known in the art, such as the deposition of a layer, such as silicon dioxide, metal, or polysilicon, followed by masking and a directional etch to form sidewall 22. Insulation for a conductive material is formed by several methods known in the art, including the conformal deposition of an insulator which can then be followed by a spacer etch.

Conductive region 24a includes a diffusion, via, stud, or conductive layer formed from materials such as a semiconductor, a metal silicide, titanium nitride, and a metal. Specifically, conductive region 24a can be doped silicon, such as single crystal or polycrystalline silicon. It can also be a metal silicide such as titanium, cobalt, tungsten, or molybdenum silicide. And it can also be a metal such as tungsten, molybdenum, titanium, and aluminum. Conductive region 24a is formed by methods known in the art, such as ion implantation or diffusion of dopants into substrate 20, by depositing a metal or doped polysilicon film, and by reacting to form a metal silicide. Conductive regions 24a and 24b can be the same or different materials. For example conductive region 24a can be a doped region while conductive region 24b is a via.

Etch stop layer 26 is formed by methods known in the art, such as oxidation of the silicon surface or chemical vapor deposition of a material such as silicon oxide or silicon nitride. Etch stop layer 26 typically is in the range from 30 to 500A thick. Any order for the formation of the three elements, sidewall 22, conductive regions 24a, 24b, and etch stop layer 26 can be used in the process described herein.

Next, conductor 28 is formed from materials such as semiconductor, a metal silicide, titanium nitride, and a metal as described above under the discussion of conductive region 24a. Conductor 28 is conformally deposited as illustrated in the cross section of FIG. 2. Conductor 28 is preferably a few hundred to a few thousand Angstroms thick and preferably has a thickness significantly less than the minimum line width achievable with photolithography. Typically, conductor 28 is not wanted along every sidewall on the wafer, so conductor 28 is then removed by methods such as masking and isotropic etching to restrict it to the region of interest encompassing the regions to be interconnected.

Frequently it is desired to form conductive region 24a and conductor 28 from the same material, usually heavily doped silicon. When this is the case, etch stop layer 26 provides means to avoid damage to conductive region 24a when conductor 28 is etched in the step described below.

Figure 3:
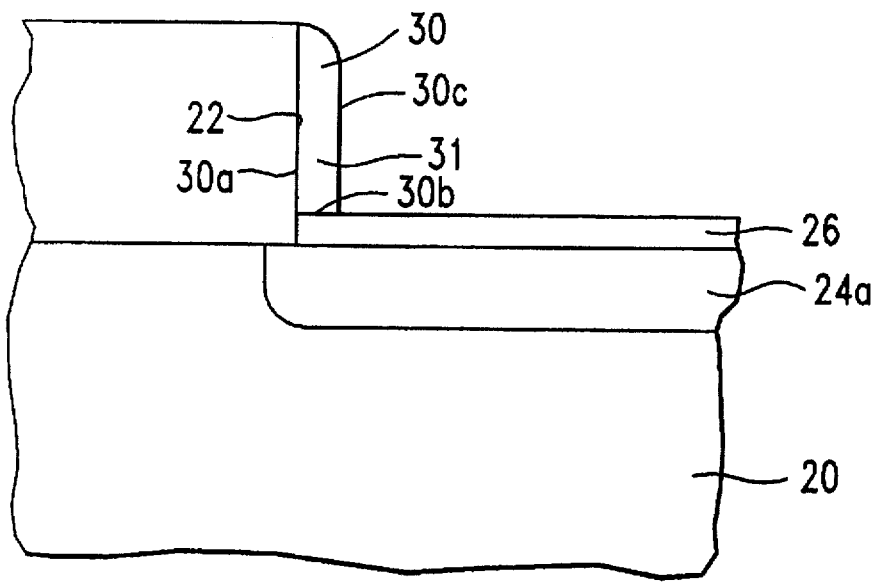

As illustrated in FIG. 3, sidewall rail 30 is formed from conductor 28 by a directional etch of conductor 28. The directional etch removes portions of conductor 28 on horizontal surfaces before substantially removing portions along vertical walls. The directional etch stops on etch stop layer 26. Thus, conductive region 24a is protected from the possibility of damage from the directional etch as horizontal portions of conductor 28 are removed over conductive region 24a. The width of sidewall rail 30 is about equal to the deposition thickness of conductor 28, as described hereinabove. Sidewall rail 30 has an inner surface 30a in contact with sidewall 22, a bottom surface 30b in contact with underlying conductive region 24a (or etch stop layer 26), and an outer surface 30c left exposed by the directional etch. A top portion 31 of sidewall rail 30 is defined by portions of rail 30 extending above bottom surface 30b, including outer surface 30c.

Figure 4:
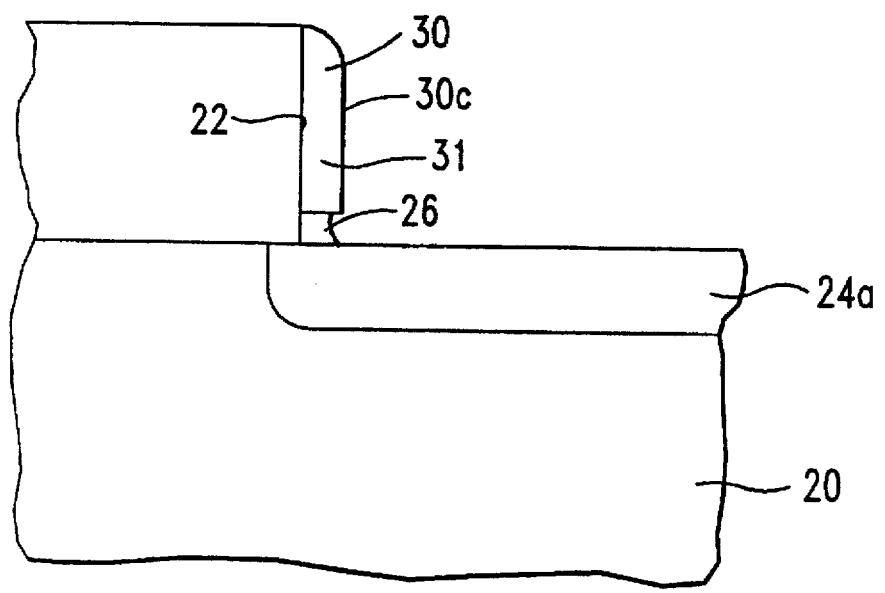

Next, exposed portions of etch stop layer 26 are removed by methods such as HF dip or plasma etch which have a high selectivity between etch stop layer 26 and conductive region 24a, as illustrated in FIG. 4. Sidewall rail 30 protects portions of etch stop layer 26 that are beneath rail 30 from this etch.

Figure 5A:
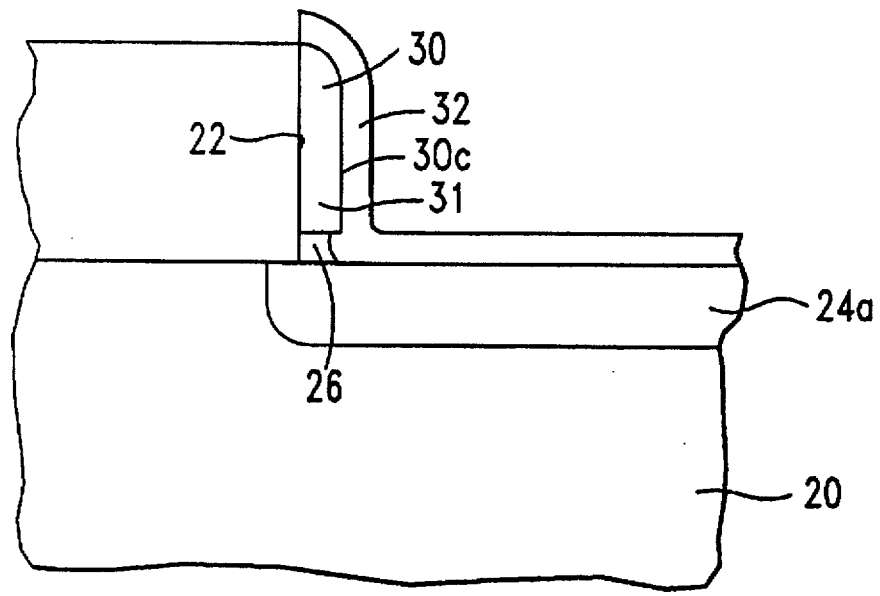
Figure 5B:
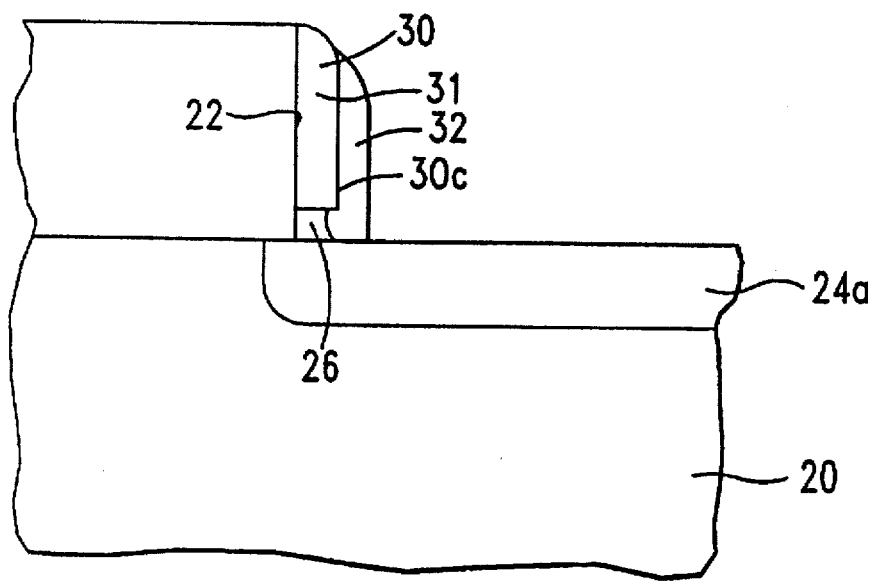

Two embodiments of the next step are illustrated in FIGS. 5a and 5b. In the embodiment illustrated in FIG. 5a, both conductive region 24a and sidewall rail 30 are formed of silicon. Conductive bridge 32 is formed across the thickness of etch stop layer 26, connecting conductive region 24a to top portion 31 of sidewall rail 30. Thus, contact is achieved between conductive region 24a and sidewall rail 30 while the process provides assurance that conductive region 24a remains undamaged by the previous directional etch step. Conductive bridge 32 is formed by growing selective silicon, a method well known in the art. Selective silicon growth is seeded from both conductive region 24 and outer surface 30c of sidewall rail 30.

Alternatively, as shown in FIG. 5b, conductive bridge 32' can be formed by depositing a thin second conductor and performing a second directional etch. Since remaining etch stop layer 26 is very thin, the second conductor can also be very thin, and therefore the over-etch required for its removal on horizontal surfaces will be minimal. Thus, conductive region 24a will be little damaged by this etch. Conductive bridge 32' can be formed from a metal silicide, titanium nitride, or a metal as described above under the discussion of conductive region 24a.

Conductive bridges 32 and 32' are examples of embodiments of a conductive member in contact with outer surface 30c of top portion 31 of conductive sidewall rail 30. The conductive member can also be a via contact, a stud contact, a conductive layer contacting or intersecting top portion 31, or another sidewall rail having a different height than sidewall rail 30. The conductive member connects top portion 31 (in particular, outer surface 30c) to a conductive region, such as conductive region 24a or to a conductive region external to the structure shown. The external conductive region can be in the same vertical level as rail 30, or it can be above or below that level.

Sidewall 22 can either be left in place or removed once sidewall rail 30 has been formed. Insulator (not shown) can be deposited to provide isolation for sidewall rails by means, such as chemical vapor deposition of a dielectric, such as silicon dioxide.

The process described hereinabove, and illustrated in FIGS. 1–5, provides the formation of a single sidewall rail connector 30 that can interconnect a pair of conductive region 24a, 24b or any other desired electrodes located adjacent to sidewall 26. The method of the invention described hereinabove also provides means for forming a rail connector extending on several vertical levels and in a plurality of directions along the plane of the chip surface, and thus has wide application in semiconductor structures, including memory and logic.

Figure 6A:
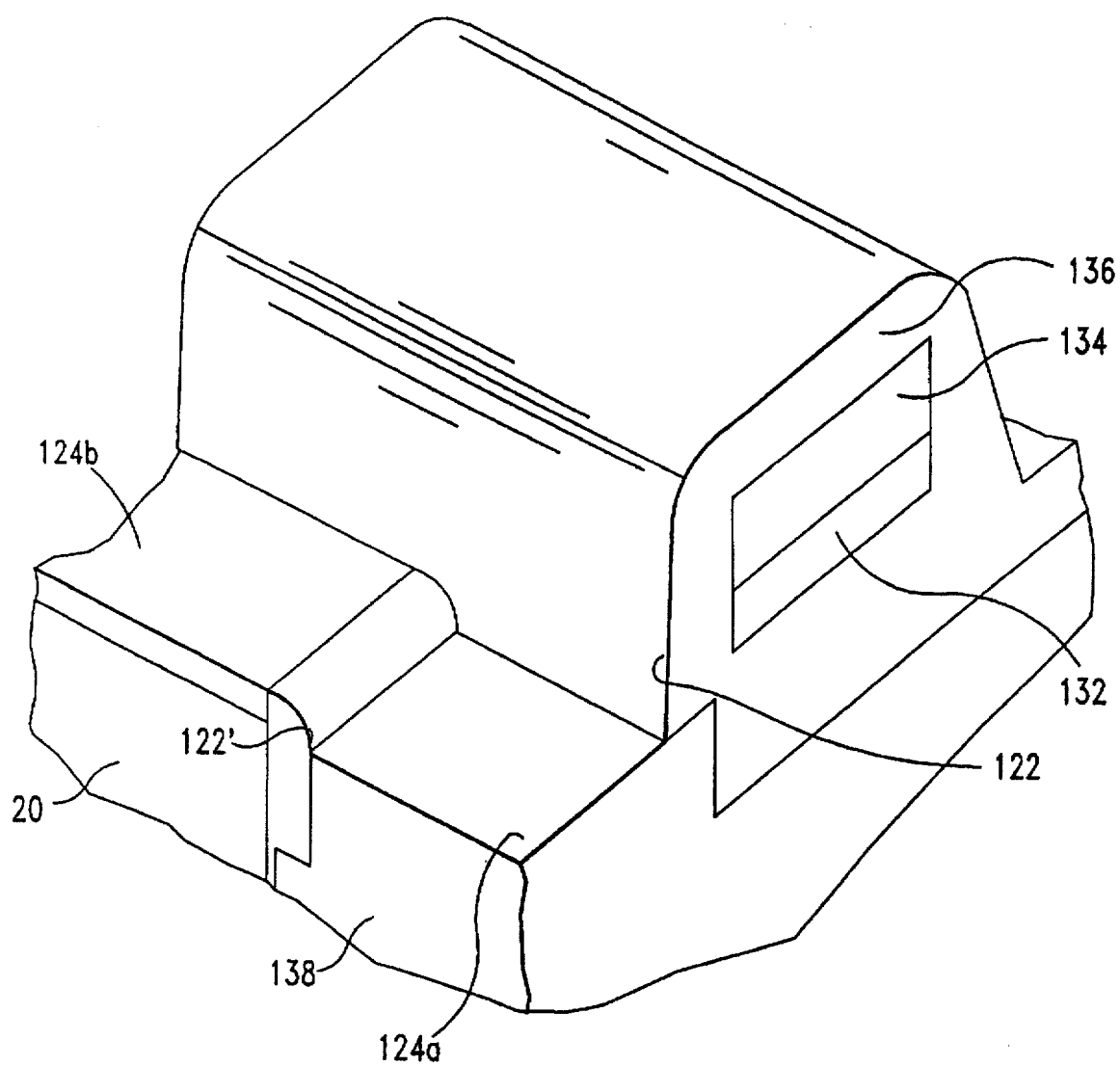
FIGS. 6a–6c are perspective views showing steps in the process of forming a strap for a DRAM cell or a T-shaped rail connector.
Figure 6B:
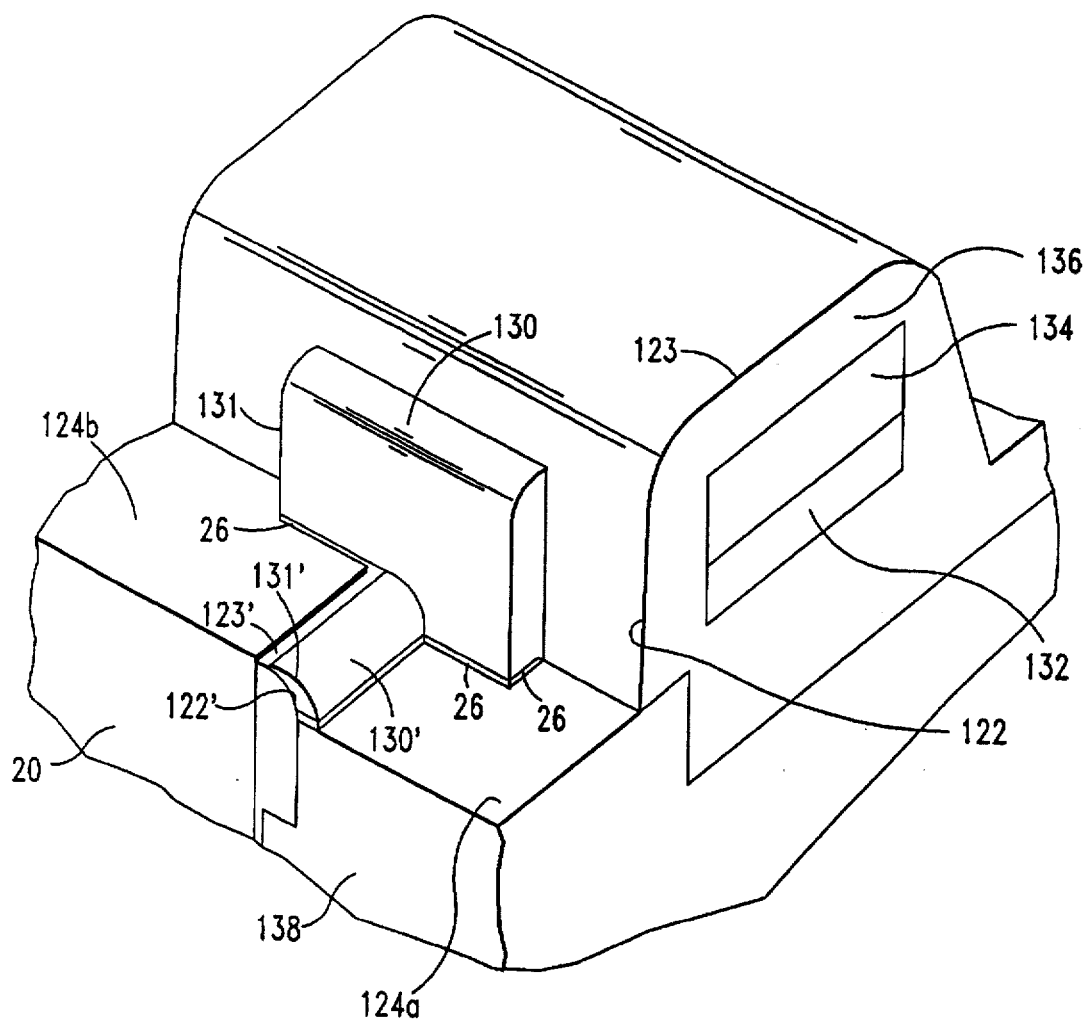
Figure 6C:
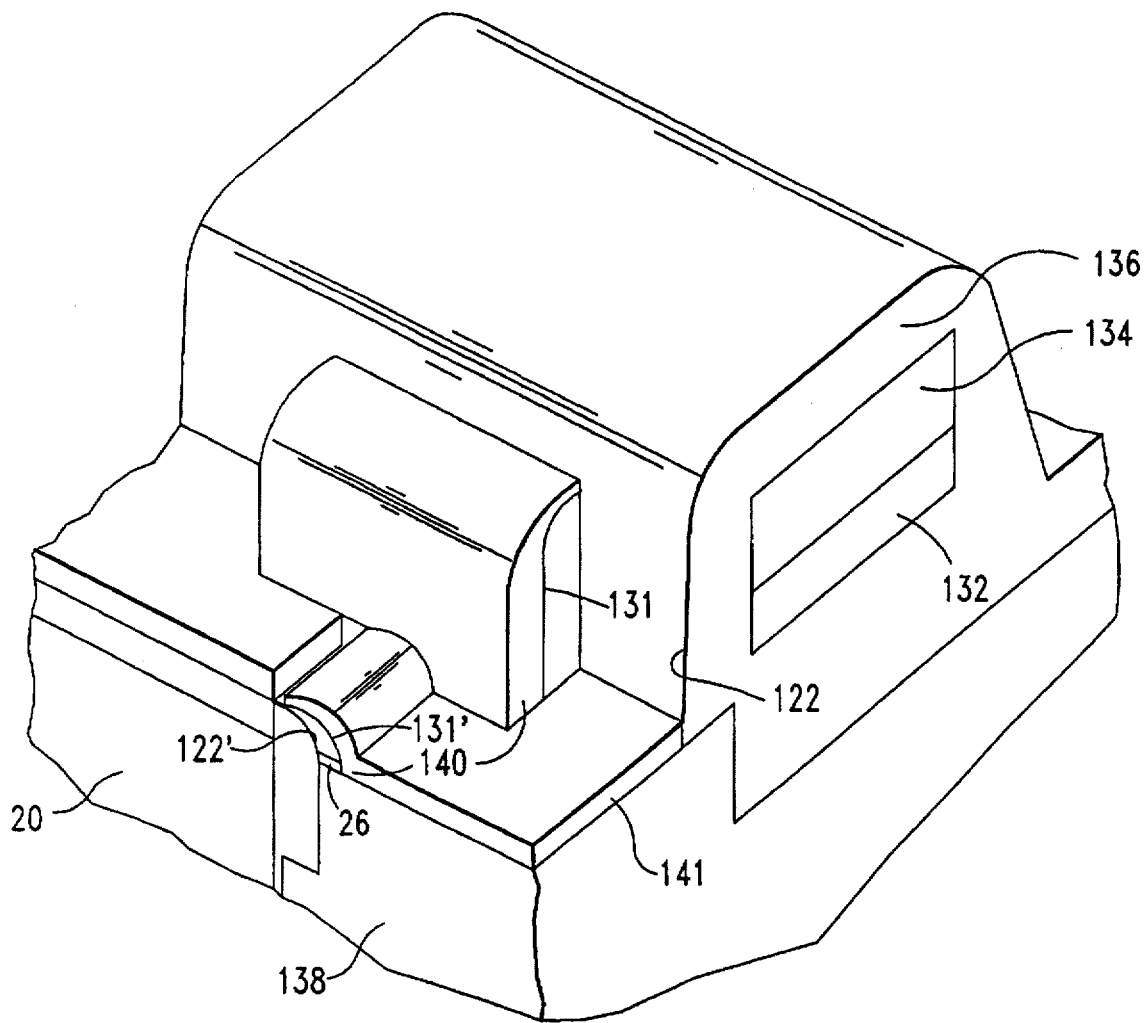

For example, FIGS. 6a–c show steps in the process of fabricating a sidewall rail connector for a surface strap of a DRAM cell. FIG. 6a shows a DRAM cell at a step in the process between that illustrated in FIG. 11 and that illustrated in FIG. 12 of commonly assigned U.S. Pat. No. 5,264,716 ("the '716 patent"), issued to D. M. Kenney, entitled "Diffused Buffed Hate Trench Dram Cell Array," incorporated herein by reference. The present invention provides an alternative to the conductive strap disclosed in the '716 patent. In FIG. 6a, the trench top oxide of FIG. 11 of the '716 patent has been removed, exposing surface conductive region 124a of polysilicon filled trench 138. With the trench-top oxide removed, surface conductive region 124a is at a lower level than the surface of node diffusion 124b. As described in the '716 patent, a silicon nitride sidewall (or spacer) has been formed, and this spacer (122, 122') lines the sidewalls of wordlines and the edge between regions 124a and 124b.

In FIG. 6a, polysilicon wordline 132 having metal silicide layer 134 and insulating layer 136, is adjacent to polysilicon filled trench 138. Trench 138 provides the storage capacitor of a DRAM cell. Conductive region 124b is a node diffusion of a transistor gated by the wordline that must be electrically connected to surface conductive region 124a of trench 138 to provide the needed electrical connection between transistor and capacitor of the cell.

As shown in FIG. 6b, "T"-shaped rail connector 130, 130' is formed along the insulated sidewall 122 of polysilicon wordline 132 and along sidewall 122' between regions 124a and 124b according to the process steps illustrated in FIGS. 1–4. First, etch stop layer 26 is formed to prevent damage to conductive region 124b during a later directional etch. A conductor is then deposited and defined with a mask in a region comprising a desired portion of the sidewalls. Directional etching is then used to remove horizontal portions of the conductor, leaving conductive sidewall rails 130 and 130' adjacent sidewalls 122 and 122'. (Alternatively, the masking step to define the conductor can be done after the directional etch). Exposed portions of etch stop layer 26 are then removed. In the final step, conductive bridge 140 connecting top portions 131 and 131' of rail connectors 130, 130' to conductive regions 124a and 124b is formed, as described above (FIGS. 5a and 5b). In the embodiment illustrated in FIG. 6c, conductive bridge 140 is formed by growing selective silicon 141. It could also be formed by depositing a thin conductor and spacer etching. Not shown in FIG. 6a–6c is the adjacent passing wordline along which the polysilicon connector is also formed (and thus, rail connector 130, 130' is actually "H"-shaped).

A maskless process could be performed incorporating the process disclosed in an article by D. M. Kenney in the IBM Technical Disclosure Bulletin Vol. 29, No. 8, January 1987, p 3423 and in commonly assigned U.S. Pat. No. 5,185,294 ("the '294 patent"), issued to C. H. Lam, et al. entitled "Boron Out-Diffused Surface Strap Process," incorporated herein by reference. The conductor and/or conductive bridge 32 or 32' is deposited first as intrinsic polysilicon that is then doped and made conductive by diffusion from an adjacent diffused region or doped polysilicon. In the present case doping is diffused from trench polysilicon and the node diffusion. Then the polysilicon that remains intrinsic is selectively etched in an etchant such as KOH and alcohol, ethylene diamine and pyrocatechol, or gallic acid etchant as described in U.S. Pat. No. 5,160,987 issued to C. W. D. Pricer, et al., incorporated herein by reference. Thus, undoped portions are removed and the strap is defined without a mask.

The more complex T-shaped (or H-shaped) structure shown for rail connector 130, 130' in FIG. 6b is formed in a single deposition and directional etch step since second sidewall 122' is provided intersecting sidewall 122. Since two sidewalls 122, 122' have top edges 123, 123' at different heights above the substrate where they intersect, as illustrated in FIG. 6b, T-shaped sidewall spacer 130, 130 ' is formed.

The structure of FIG. 6c permits a larger area of contact to trench polysilicon 138 than would be available with the single rail connector of the first embodiment. It also relaxes the requirement that the two conductive regions be at the same vertical level, permitting connection among conductive regions in arbitrary directions and at several vertical levels.

While FIGS. 6a–6c show steps in interconnecting only two conductive regions 124a and 124b along sidewall 122 and 122', for other purposes, a third conductive region along sidewall 122' could also be connected by means of "T" extension 130'. "T" extension 130' can be located between the two other contact regions (as illustrated in FIG. 6b, regions 124a and 124b) or its supporting sidewall 122' can be located to intersect any other position along sidewall 122. "T" extension 130' is formed of materials as described above for sidewall rail connector 30. Also, if desired, sidewalls 122 and 122' can be removed once sidewall rail connectors 130, 130' have been formed.

If the region underlying sidewall rail 130, 130' is formed of a material with substantially different etch rate than that of sidewall rail 130 (or if limited etching of this region is tolerable) then the structure and method of forming sidewall interconnect 130, 130' is simplified. Process steps to form, etch, and bridge etch stop layer 26 are not needed and can be eliminated. In this case, since etch stop layer 26 will not be present, sidewall rail 130, 130' is formed in contact with the underlying layer.

While several embodiments of the invention, together with modifications thereof, have been described in detail herein and illustrated in the accompanying drawings, it will be evident that various further modifications are possible without departing from the scope of the invention. For example, a wide range of conductive materials can be used for conductive region 24a and sidewall rail 30. Furthermore there can be a plurality of conductive members contacting top portion 31 of conductive sidewall rail 30. Nothing in the above specification is intended to limit the invention more narrowly than the appended claims. The examples given are intended only to be illustrative rather than exclusive.

What is claimed is:

1. A semiconductor structure, comprising:

a first conductive sidewall rail having a first outer surface, said first outer surface extending horizontally to define a rail direction;

a first and a second conductive region adjacent said rail, said second conductive region being displaced in said rail direction from said first conductive region, said second conductive region being electrically connected to said first conductive sidewall rail;

a conductive member contacting said first outer surface, said conductive member connecting said first rail to said first conductive region, said conductive member being distinct from said first conductive region; and said first and second conductive regions being electrically connected exclusively through said first conductive sidewall rail.

2. A sidewall connector as recited in claim 1, wherein said first conductive region is a diffused region.

3. A sidewall connector as recited in claim 2, wherein said conductive member is a conductive bridge.

4. A sidewall connector as recited in claim 3, wherein said rail connects a pair of electronic devices.

5. A sidewall connector as recited in claim 1, wherein said conductive member is a second conductive sidewall rail on said substrate, said second rail having a second outer surface, said first outer surface having a portion extending above said second outer surface.

6. A sidewall connector as recited in claim 1, further comprising:

an etch stop layer located on a first portion of said first conductive region, and absent from a second portion of said first conductive region;

said first conductive sidewall rail being on said etch stop layer; and a conductive bridge linking said second portion of said first conductive region and said first outer surface.

7. A sidewall connector as recited in claim 6, wherein said conductive bridge comprises selectively grown silicon.

8. A sidewall connector as recited in claim 1, further comprising a first sidewall adjacent said first conductive sidewall rail.

9. A sidewall connector as recited in claim 1, wherein said second conductive region is horizontally displaced from said first conductive region.

10. A sidewall connector for semiconductor devices comprising:

a first conductive sidewall rail extending horizontally to define a first rail direction, said first rail having a first top portion comprising a first outer surface; and a second conductive sidewall rail extending horizontally to define a second rail direction said second rail direction different from said first rail direction, said second rail contacting said first rail, said second rail having a second top portion comprising a second outer surface, said first outer surface having a portion extending above said second outer surface said first outer surface intersecting said second outer surface.

11. A sidewall connector as recited in claim 10, said first outer surface intersecting said second outer surface at an angle.

12. A sidewall connector as recited in claim 11, wherein the sidewall connector is "T" shaped.

13. A semiconductor structure, comprising:

a first conductive region having a first portion and a second portion;

an etch stop layer being a step of a stepped structure on said first portion of said first conductive region, said second portion of said first conductive region being free of said etch stop layer;

a first conductive sidewall rail on said etch stop layer step, said first conductive sidewall rail having a first top portion comprising a first outer surface;

a conductive member contacting said first outer surface, said conductive member connecting said first rail to said second portion of said first conductive region; and a second conductive region displace from said first conductive region, wherein said first conductive sidewall rail electrically connects said first conductive region and said second conductive region.

14. A semiconductor device as recited in claim 13, said first conductive region being a diffused region.

15. A semiconductor device as recited in claim 13, said conductive member being a conductive bridge.

16. A sidewall connector as recited in claim 15, said conductive bridge being selectively grown silicon.

17. A sidewall connector as recited in claim 13, said conductive member being a second conductive sidewall rail on said substrate, said second rail having a second outer surface, said first outer surface having a portion extending above said second outer surface.

18. A sidewall connector as recited in claim 13, further comprising a first sidewall adjacent said first conductive sidewall rail.

* * * * *